(12) United States Patent
Bedell et al.

(10) Patent No.: US 9,306,106 B2
(45) Date of Patent: Apr. 5, 2016

(54) MONOLITHIC INTEGRATION OF HETEROJUNCTION SOLAR CELLS

(71) Applicant: INTERNATIONAL BUSINESS MACHINES CORPORATION, Armonk, NY (US)

(72) Inventors: Stephen W. Bedell, Wappingers Falls, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 359 days.

(21) Appl. No.: 13/718,819

(22) Filed: Dec. 18, 2012

(65) Prior Publication Data
US 2014/0170807 A1 Jun. 19, 2014

(51) Int. Cl.
*H01L 31/0747* (2012.01)
*H01L 31/068* (2012.01)
(Continued)

(52) U.S. Cl.
CPC ........ *H01L 31/0747* (2013.01); *H01L 31/0475* (2014.12); *H01L 31/0504* (2013.01); *H01L 31/0684* (2013.01); *H01L 31/1876* (2013.01); *H01L 31/1888* (2013.01); *H01L 31/204* (2013.01); *H01L 31/208* (2013.01); *Y02E 10/50* (2013.01)

(58) Field of Classification Search
CPC ................ H01L 31/0747; H01L 31/0684
USPC ..................................... 136/255, 258
See application file for complete search history.

(56) References Cited

U.S. PATENT DOCUMENTS

| 4,070,205 A | 1/1978 | Rahilly |
| 4,496,788 A | 1/1985 | Hamakawa et al. |

(Continued)

FOREIGN PATENT DOCUMENTS

| JP | 10189927 | 7/1998 |
| JP | 2000188408 | 7/2000 |

(Continued)

OTHER PUBLICATIONS

Ma, Z.Q., et al. "TCO-SI Based Heterojunction Photovoltaic Devices" Solar Cells—Thin-Film Technologies, InTech. Nov. 2011. pp. 111-137.

(Continued)

*Primary Examiner* — Michael Lebentritt
*Assistant Examiner* — Aaron Dehne
(74) *Attorney, Agent, or Firm* — Tutunjian & Bitetto, P.C.; Louis J. Percello

(57) ABSTRACT

A method for fabricating a device with integrated photovoltaic cells includes supporting a semiconductor substrate on a first handle substrate and doping the semiconductor substrate to form doped alternating regions with opposite conductivity. A doped layer is formed over a first side the semiconductor substrate. A conductive material is patterned over the doped layer to form conductive islands such that the conductive islands are aligned with the alternating regions to define a plurality of photovoltaic cells connected in series on a monolithic structure.

10 Claims, 8 Drawing Sheets

(51) Int. Cl.
  *H01L 31/05* (2014.01)
  *H01L 31/0475* (2014.01)
  *H01L 31/18* (2006.01)
  *H01L 31/20* (2006.01)

(56) References Cited

U.S. PATENT DOCUMENTS

| | | |
|---|---|---|
| 5,575,861 A | 11/1996 | Younan et al. |
| 5,580,381 A | 12/1996 | Yamagata |
| 7,476,420 B2 | 1/2009 | Skarp et al. |
| 7,804,023 B2 | 9/2010 | Wong et al. |
| 7,816,236 B2 | 10/2010 | Bauer et al. |
| 8,080,856 B2 | 12/2011 | Golan et al. |
| 8,114,702 B2 | 2/2012 | Gilman |
| 8,124,870 B2 | 2/2012 | Woods et al. |
| 8,168,881 B2 | 5/2012 | Beernink et al. |
| 8,207,442 B2 | 6/2012 | Woods et al. |
| 2003/0168578 A1 | 9/2003 | Taguchi et al. |
| 2005/0139252 A1* | 6/2005 | Shim .................. 136/244 |
| 2006/0162768 A1 | 7/2006 | Wanlass et al. |
| 2007/0235759 A1 | 10/2007 | Henson et al. |
| 2008/0230116 A1 | 9/2008 | Kannou et al. |
| 2009/0215219 A1 | 8/2009 | Ajiki et al. |
| 2010/0059100 A1 | 3/2010 | Kim et al. |
| 2010/0101633 A1 | 4/2010 | Park et al. |
| 2010/0186802 A1 | 7/2010 | Borden |
| 2010/0221867 A1 | 9/2010 | Bedell et al. |
| 2010/0229928 A1* | 9/2010 | Zuniga et al. .................. 136/255 |
| 2011/0139250 A1 | 6/2011 | Du et al. |
| 2011/0186111 A1 | 8/2011 | Straboni et al. |
| 2011/0265857 A1 | 11/2011 | Wang et al. |
| 2011/0287578 A1 | 11/2011 | Wojtczuk et al. |
| 2012/0138129 A1 | 6/2012 | Kim et al. |
| 2012/0160313 A1 | 6/2012 | Woods et al. |
| 2013/0291932 A1* | 11/2013 | Bateman ............ H01L 31/0682 136/255 |

FOREIGN PATENT DOCUMENTS

| | | |
|---|---|---|
| JP | 2011223022 | 11/2011 |
| WO | WO2009094578 | 7/2009 |
| WO | WO2010112129 | 10/2010 |

OTHER PUBLICATIONS

Rand, J.A., et al. "Monolithically Integrated Silicon-Film Photovoltaic Modules" Twenty Third IEEE Photovoltaic Specialists Conference. May 1993. pp. 214-219.

Non-Final Office Action for U.S. Appl. No. 13/748,672 mailed on Aug. 12, 2015.

Non-Final Office Action for Application No. 14/718,916 mailed on Dec. 3, 2015.

* cited by examiner

FIG. 1A
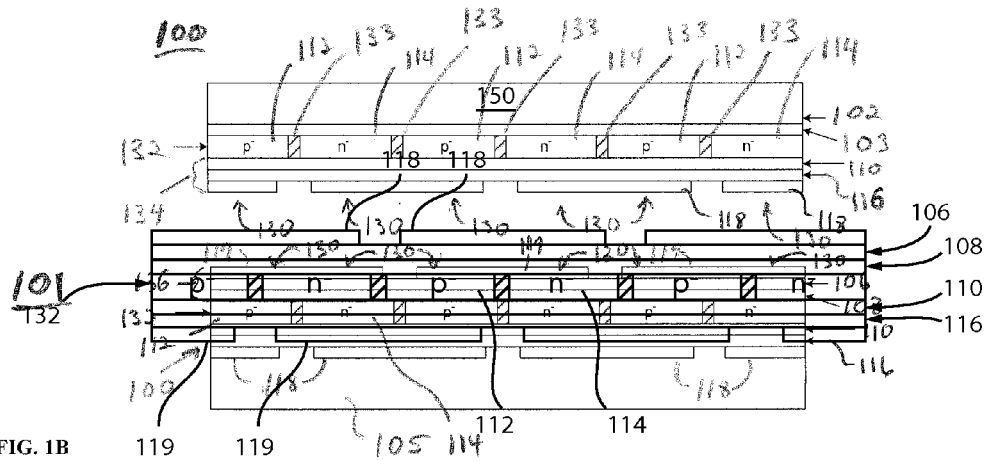
FIG. 1B  FIG. 1C
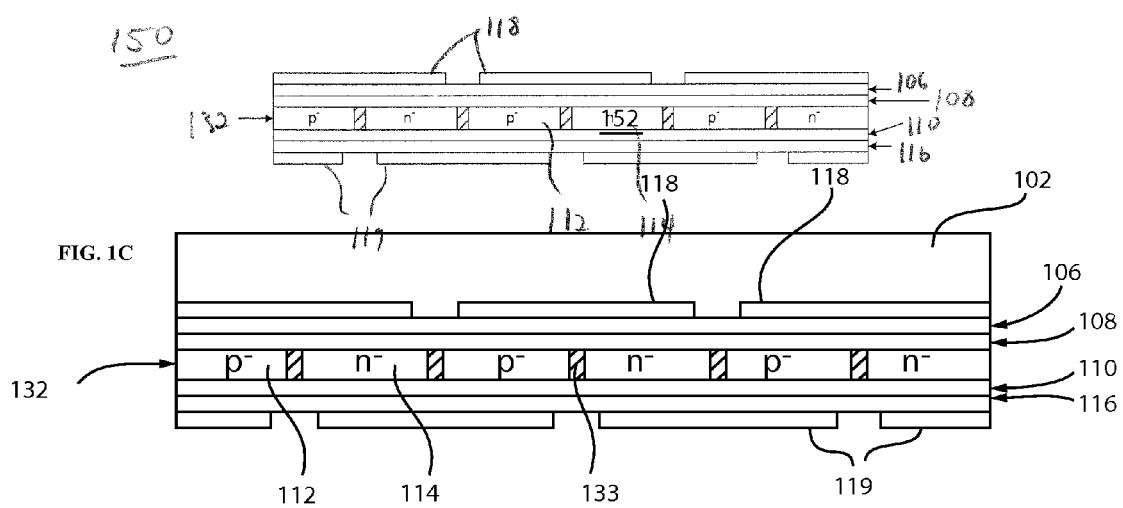
FIG. 1D

MONOLITHIC INTEGRATION OF HETEROJUNCTION SOLAR CELLS

BACKGROUND

1. Technical Field

The present invention relates to photovoltaic devices and fabrication methods, and more particularly to monolithic integration of photovoltaic cells in a semiconductor substrate.

2. Description of the Related Art

Monolithic integration of solar cells is desirable for realizing high-voltage power supplies for various applications such as powering up a chip or autonomous circuit operation. Heterojunction solar cells are of interest for this purpose, generally due to their high-efficiency and, more particularly, heterojunction solar cells result in higher open circuit voltages than homojunction solar cells at comparable conversion efficiency values.

SUMMARY

A method for fabricating a device with integrated photovoltaic cells includes supporting a semiconductor substrate on a first handle substrate and doping the semiconductor substrate to form alternating regions with opposite conductivity. A doped layer is formed over a first side the semiconductor substrate. A conductive material is patterned over the doped layer to form conductive islands such that the conductive islands are aligned with the alternating regions to define a plurality of photovoltaic cells connected in series on a monolithic structure.

Another method for fabricating a device with integrated photovoltaic cells includes doping a semiconductor layer on a buried dielectric layer of a semiconductor-on-insulator substrate to form alternating regions of higher and lower dopant concentration across the semiconductor layer; forming at least one doped layer over a first side the semiconductor layer; and patterning a conductive material over the least one doped layer to form conductive islands such that the conductive islands are aligned with the alternating regions of high and low doping concentration to define a plurality of photovoltaic cells connected in series on a monolithic structure.

Yet another method for fabricating a device with integrated photovoltaic cells includes doping a semiconductor layer on a buried dielectric layer of a semiconductor-on-insulator substrate to form alternating regions of higher and lower dopant concentration across the semiconductor layer; forming at least one doped layer semiconductor over a first side the semiconductor layer, the at least one doped layer including a hydrogenated crystalline semiconductor material; patterning a conductive material over the least one doped layer to form conductive islands such that the conductive islands are aligned with the alternating regions of high and low doping concentration to define a plurality of photovoltaic cells connected in series on a monolithic structure; and etching the at least one doped layer using the conductive islands as an etch mask to create spacings between portions of the at least one doped layer corresponding with each of the plurality of photovoltaic cells.

A device with integrated photovoltaic cells includes a semiconductor substrate including doped alternating regions with opposite conductivity and at least one doped layer formed over a first side the semiconductor substrate. A patterned conductive material is formed over the least one doped layer forming conductive islands such that the conductive islands are aligned with the alternating regions to define a plurality of photovoltaic cells connected in series on a monolithic structure.

Another device with integrated photovoltaic cells includes a semiconductor-on-insulator substrate having a base semiconductor, thin semiconductor layer and a buried dielectric layer therebetween, the thin semiconductor layer having alternating regions of higher and lower dopant concentration across the thin semiconductor layer. At least one doped layer is formed over a first side the semiconductor layer, and a patterned conductive material is formed over the least one doped layer forming conductive islands such that the conductive islands are aligned with the alternating regions to define a plurality of photovoltaic cells connected in series on a monolithic structure.

Yet another device with integrated photovoltaic cells includes a semiconductor-on-insulator substrate having a base semiconductor, thin semiconductor layer and a buried dielectric layer therebetween, the thin semiconductor layer having alternating regions of higher and lower dopant concentration across the thin semiconductor layer. At least one doped layer is formed over a first side the thin semiconductor layer. The at least one doped layer includes a crystalline semiconductor material. A patterned conductive material is formed over the least one doped layer forming conductive islands such that the conductive islands are aligned with the alternating regions of high and low doping concentration to define a plurality of photovoltaic cells connected in series on a monolithic structure. Spacings are formed between portions of the at least one doped layer corresponding with each of the plurality of photovoltaic cells.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1C is a cross-sectional view of the device of FIG. 1B with the second handle substrate removed in accordance with the present principles;

FIG. 1D is a cross-sectional view of the device of FIG. 1A having a reverse stacking of layers relative to a handle substrate in accordance with the present principles;

DETAILED DESCRIPTION OF PREFERRED EMBODIMENTS

Figure 1A:
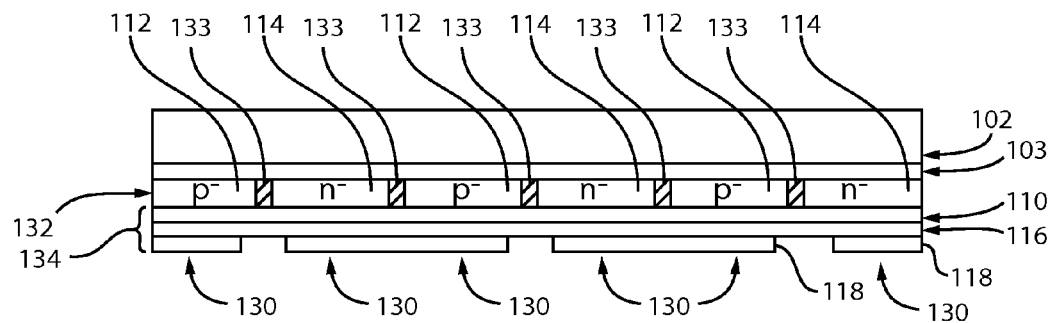
FIG. 1A is a cross-sectional view of a device having a plurality of photovoltaic cells monolithically integrated and connected in series on a thin substrate, coupled to a handle substrate, in accordance with the present principles.

In accordance with the present principles, monolithic integration and resulting devices are provided for photovoltaic cells. In one embodiment, heterojunction solar cells, and in particular heterojunction with thin intrinsic layer (HIT) cells, are integrated on thin body semiconductor-on-insulator substrates and/or thin layers of crystalline semiconductors. The photovoltaic cells share at least a substrate therebetween and are connected in series to increase the output voltage of the integrated photovoltaic structure. This is because the open circuit voltage of the integrated photovoltaic structure is, to the first order, equal to the sum of the open circuit voltages of the individual solar cell units connected in series.

It is to be understood that the present invention will be described in terms of a given illustrative architecture placed on a wafer; however, other architectures, structures, substrate materials and process features and steps may be varied within the scope of the present invention. It is also to be understood that the present invention may include tandem (multi-junction) structures.

It will also be further understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_x$, $Ga_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1A, a partially fabricated photovoltaic device 100 is illustratively shown. In one embodiment, a stack of layers 134 including a thin semiconductor layer or substrate 132 is bonded to a support or handle substrate 102. A selectively removable sacrificial layer 103 may be employed for transferring the substrate 132, if needed, as will be described. The substrate 102 is bonded to the substrate 132 and a stack of layers 134 is formed on the substrate 132. Substrate or layer 132 includes a p⁻ or n⁻ doped semiconductor material, such as Si, SiGe, Ge, SiC, III-V, etc. Substrate or layer 132 is further doped into p⁻ or n⁻ regions 112 or 114, respectively, by known doping techniques, such as, e.g., selective implantation and/or diffusion (if the semiconductor is n⁻, the doped regions are p⁻ and vice versa). This is preferably performed on the semiconductor substrate 132 (host substrate) prior to layer transfer and layer formation on the substrate 132 to prevent high temperature damage if other layers were present during the doping process. Isolation regions 133 may be formed by doping or by etching sections followed by depositing a dielectric material in the regions 133.

A stack of layers 134 includes an intrinsic layer 110, which may include amorphous hydrogenated silicon (a-Si:H), although other materials may be employed. A doped layer 116 may include an a-Si:H (p⁺ or n⁺) layer. A transparent conductive oxide 118 (TCO), e.g., ZnO, indium tin oxide (ITO), etc. is deposited on doped layer 116. The TCO 118 is patterned by performing an isolation etch to form TCO islands 118.

Note that instead of depositing and patterning the TCO 118, patterned TCO may be deposited by using shadow masks. In some embodiments, the isolation etch is performed on the host substrate 132. (i.e., prior to layer transfer). In some embodiments, isolation is performed by techniques other than etching, for example by selective (i.e. masked) implantation to locally amorphize sections of the TCO islands 118 and therefore reduce the conductivity or by local oxidation/nitridation for example by local laser radiation or implantation of oxygen or nitrogen. These techniques are preferably performed on the host substrate 132 prior to layer transfer.

Low-temperature bonding may be employed after layers are formed on the substrate 132 as will be described. However, the stack of layers 134 as shown in FIG. 1A may be employed as monofacial device with multiple photovoltaic cells 130. The cells 130 are connected in series and include TCO islands aligned with the alternating doped regions 112 and 114. It should be understood that the handle or holding substrate 102 may remain as part of the device 100 or be removed and the substrate 132 transferred to another platform or substrate.

Figure 1B:
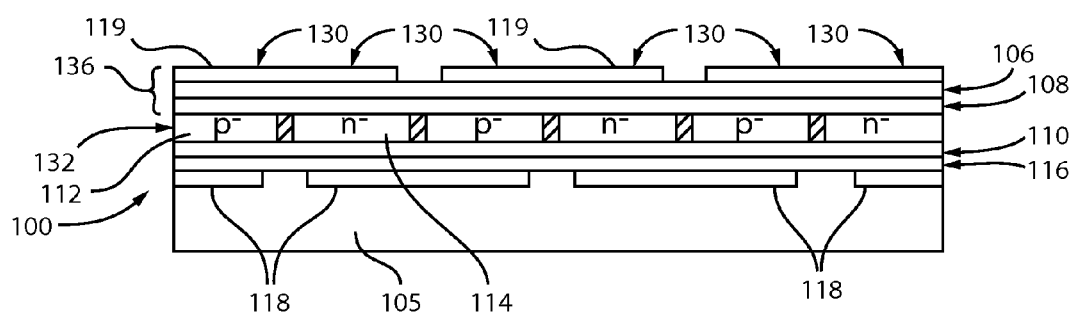
FIG. 1B is a cross-sectional view of the device of FIG. 1A further processed to form a plurality of photovoltaic cells monolithically integrated and connected in series on a second side of the thin substrate by transferring the thin substrate to a second handle substrate in accordance with the present principles.

Referring to FIG. 1B, the stack of layers 134 and substrate 132 are transferred to another platform or substrate. This may be to provide additional cell junctions and/or electrodes on an opposite face or side of the substrate 132 or to transfer the device 100 to another device or platform. In one embodiment, the device 100 is bonded to a second handle or holding substrate 105 on an opposite side from the handle substrate 102. Then, the substrate 102 is debonded. In one embodiment, this may include removing the sacrificial layer 103 by and etch or other process. It should also be understood that wafer bonding and removal may include any number of processes in addition to those described herein. For example, spalling techniques, adhesive bonding and release agents, etc. may be employed.

Now, a second side of the substrate 132 is exposed and may be employed for formation of additional layers to complete a device 101. A stack of layers 136 includes an intrinsic layer 108, a doped layer 106 (n⁺ or p⁺). The doping of layer 106 has opposite conductivity relative to layer 116. For example, if layer 106 is p⁺ doped, layer 116 is n⁺ doped. The layers 106 and 108 may include a-Si:H although other suitable materials may be employed. A conductive material (e.g., TCO) 119 is deposited on the other side of the substrate 132, followed by patterning of the material to form islands 119 using one of the techniques described above. This forms a plurality of adjacent solar cells 130 monolithically integrated in a same substrate.

Since the a-Si:H layers (106, 108, 110, 116) are very thin and the conductivity of the doped a-Si:H layers 106, 116 is generally low (e.g., conductivity of lower than 0.01 (Ω·cm)⁻¹, i.e., sheet resistance of ~100 MΩ/Sq. or higher for layers of ~10 nm or thinner), lateral conduction of these layers 106, 116 is negligible. Therefore, effectively, the adjacent solar cells 130 are laterally isolated and connected in series only through electrical connections made by the TCO layers 118 and 119. In some embodiments, the patterned TCO 118, 119 may be used as a mask to remove the a-Si:H layers 106, 108, 110, 116 in between the two adjacent cells 130. Note than the TCO layers 118 or 119 on one side of the substrate may be replaced by metal layers as transparency is needed only on one side of the substrate 132 (to allow light to enter the solar cell). However, TCO 118, 119 may be used on both sides for bifacial operation (to allow light to enter from both sides). This is shown in one embodiment in FIG. 1C after the handle substrate 105 has been debonded. It should be understood that the substrate 105 may remain in place in the finished device, and may be transparent for receiving light therethrough (for monofacial or bifacial operation). Alternately, the substrate 105 may be removed as well using, e.g., a sacrificial layer.

FIG. 1C shows an illustrative device 150 having no handle substrate. The device 150 may provide monofacial or bifacial operation. The device may be transferred to a printed wiring board, substrate or other surface or device using the transfer processes described above where light can be received from both a top and bottom.

In some embodiments, as in FIG. 1B, the support substrates 102 or 105 may be permanent. Before bonding the stack of layers 134 to the support substrate 105, a layer of reflective metal (such as silver) may be formed on the back of the TCO layer 118 (or TCO layers 119) on one side (for example after TCO deposition followed by simultaneous patterning of the TCO and the reflective metal, or by using the same shadow mask to deposit the patterned TCO and metal) to increase the reflection of light back into the solar cell for better light trapping (a back reflector). Since the heterojunction solar cells 130 are connected in series, the output voltage of the integrated unit is increased accordingly. If the handle substrate 105 (or 102) is flexible, the integrated unit (100, 101) may be used as a flexible power supply in applications that require flexibility such as wearable electronics or flexible displays.

FIG. 1D shows a device 152 where light can be received through the substrate 102 which is employed as a permanent part of the device. The substrate 102 is transparent and may be formed from glass, polymer or other transparent material and permit bifacial operation.

Figure 2:
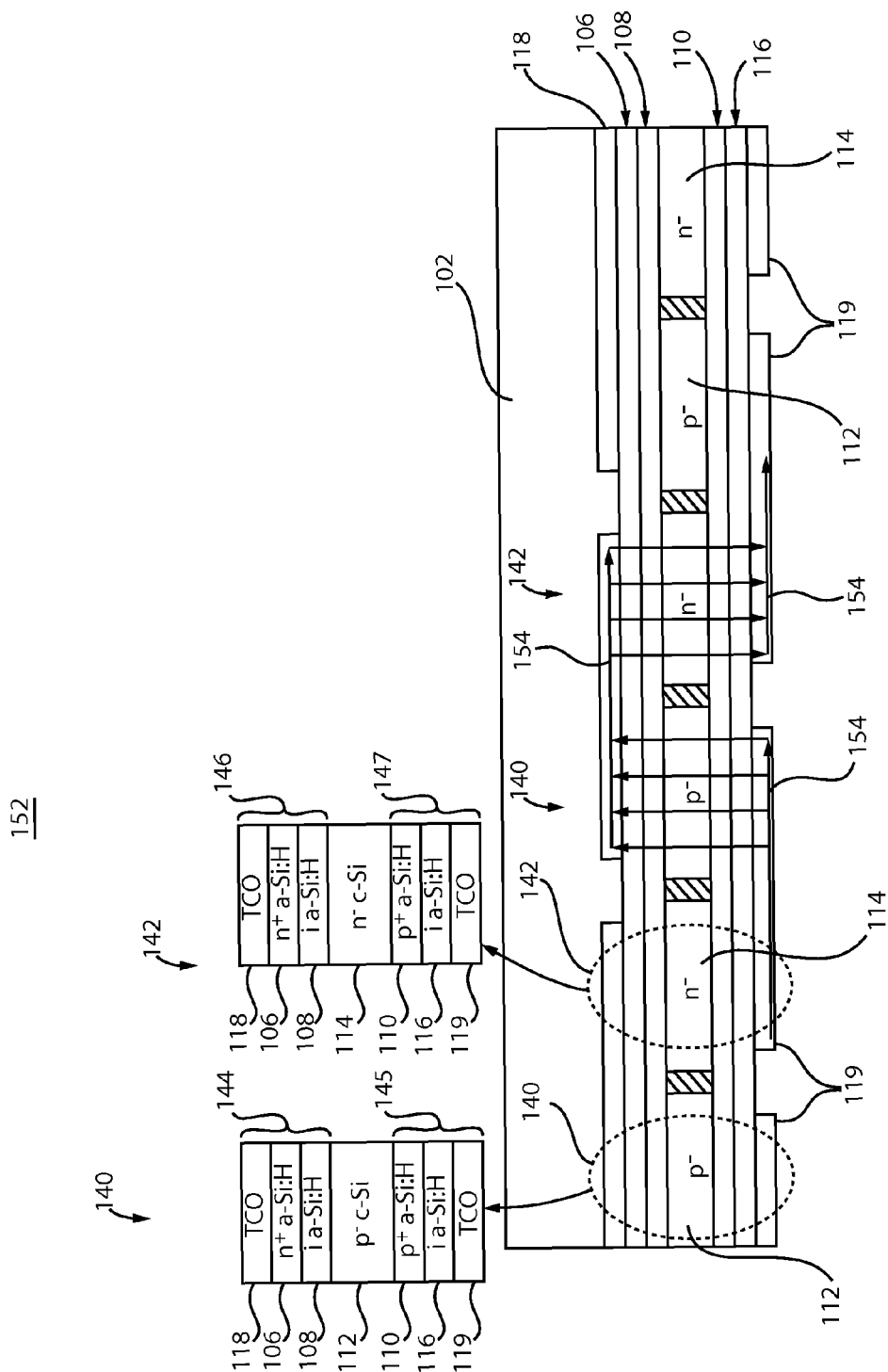
FIG. 2 is a cross-sectional view of the device of FIG. 1D showing heterogeneous photovoltaic cells connected in series in accordance with the present principles.

Referring to FIG. 2, the device 152 of FIG. 1D is illustratively depicted to show series connections between adjacent cells 140 and 142. In addition, materials employed are provided to illustrate the structure in accordance with one embodiment, other materials and structures may also be employed. A first heterojunction cell 140 includes an emitter portion 144 and a back-surface-field (BSF) contact portion 145. In this example, the emitter portion 144 of the cell 140 includes TCO 118, n+ a-Si:H layer 106, and intrinsic a-Si:H layer 108. The BSF portion 145 of the cell 140 includes p+ a-Si:H layer 110, intrinsic a-Si:H layer 116 and TCO 119. A p− c-Si substrate 112 is disposed between the emitter portion 144 and the BSF portion 145.

A second heterojunction cell 142 (adjacent to the first cell 140 and connected in series through the TCO 118 and 119) includes an emitter portion 147 and a BSF contact portion 146. In this example, the emitter portion 147 of the cell 142 includes p+ a-Si:H layer 110, intrinsic a-Si:H layer 116 and TCO 119. The BSF portion 146 of the cell 142 includes TCO 118, n+ a-Si:H layer 106, and intrinsic a-Si:H layer 108. An n− c-Si substrate 114 is disposed between the emitter portion 147 and the BSF portion 146.

In FIG. 2, lines 154 illustratively show the flow of current between adjacent cells 140 and 142. The photovoltaic cells 140 and 142 share at least the substrate layer 132 therebetween and are connected in series through TCO 118, 119 to increase the output voltage of the integrated photovoltaic structure. The open circuit voltage of the integrated photovoltaic structure is, to the first order, equal to the sum of the open circuit voltages of the individual solar cell units connected in series. Note that similar operation and structure is provided by the structures of FIGS. 1B and 1C.

Figure 3A:
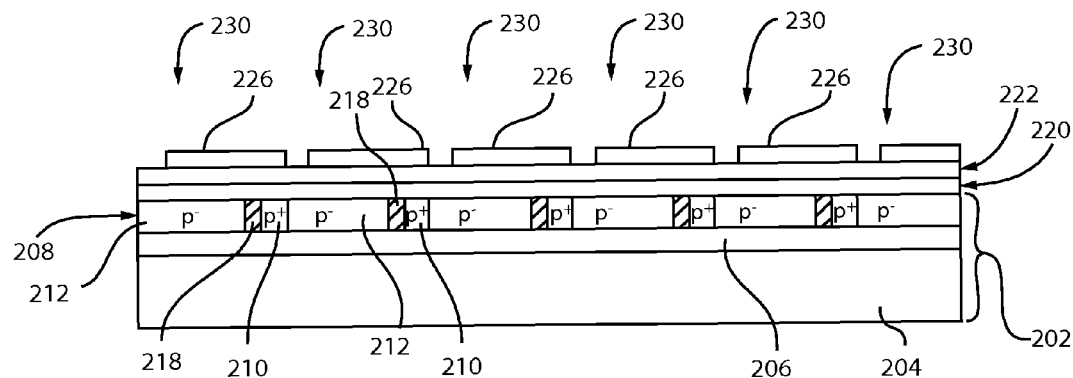
FIG. 3A is a cross-sectional view of a device having a plurality of photovoltaic cells monolithically integrated and connected in series on a SOI substrate in accordance with the present principles.
Figure 3B:
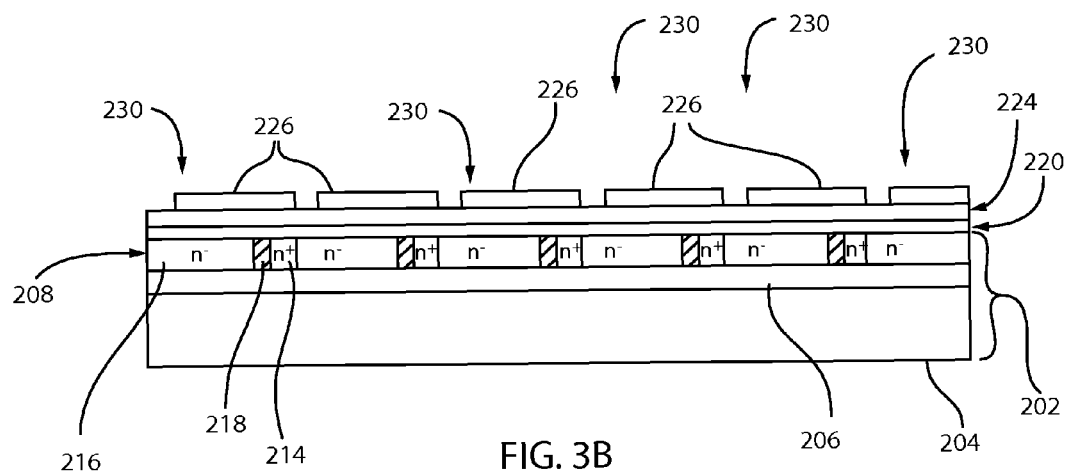
FIG. 3B is a cross-sectional view of the device of FIG. 3A wherein the substrate and doping layer have a dopant type having an opposite conductivity from that of FIG. 3A in accordance with the present principles.

Referring to FIGS. 3A and 3B, another exemplary integration scheme is illustratively shown that employs a semiconductor-on-insulator (SOI) substrate 202. The SOI substrate 202 includes a base substrate 204 and buried dielectric layer 206 and a thin crystalline layer or substrate layer 208. The substrate layer 208 is doped by known methods to form high-low doped regions 210, 212, which respectively include p$^+$ and p$^-$ doped regions in FIG. 3A, and high-low doped regions 214, 216, which respectively include n$^+$ and n$^-$ doped regions in FIG. 3B. The doped regions 210, 212, 214, 216 may be formed by, for example, masked implantation. The p− (212) and p+ (210) regions alternate with the p+ regions preferably being smaller, and the n− (216) and n+ (214) regions alternate with the n+ regions preferably being smaller. Isolation regions 218 are also formed by, e.g., etching or other techniques known in the art. Next, an intrinsic layer 220 is formed on the substrate 208. An n$^+$ doped layer 222 (FIG. 2A) or a p$^+$ doped layer 224 (FIG. 2B) is deposited on the intrinsic layer 220. The intrinsic layer 220 and the doped layers 222, 224 may include a-Si:H, although other suitable materials may be employed. A TCO stack is deposited and etched to form TCO islands 226 as described above.

Due to the negligible lateral conduction of the doped layers 222 and 224, heterojunction solar cells 230 are integrated in series. In some embodiments, the patterned TCO 226 may be used as a mask to create spacings between portions of the layers 220, 222, 224. This structure is illustratively depicted in FIGS. 5A and 5B where the layers in between two adjacent cells 330 are etched. Note that the doped layers 222, and 224 form a tunnel junction with the doped regions 210 and 214, respectively, due to the thin intrinsic layers 220 and to the first order may be approximated as an ohmic contact (in the vertical direction). The thickness of the intrinsic layer (108, 110, 220) in the embodiments of FIGS. 1A-1D and FIGS. 3A-3B is preferably below about 10 nm, although thicker layers may be employed. The thickness of the doped layers (106, 116, 222, 224) is preferably in the range of about 3-20 nm, although thinner or thicker layers may be employed. Note that the intrinsic layer (108, 110, 220) may be omitted in some embodiments.

Figure 4:
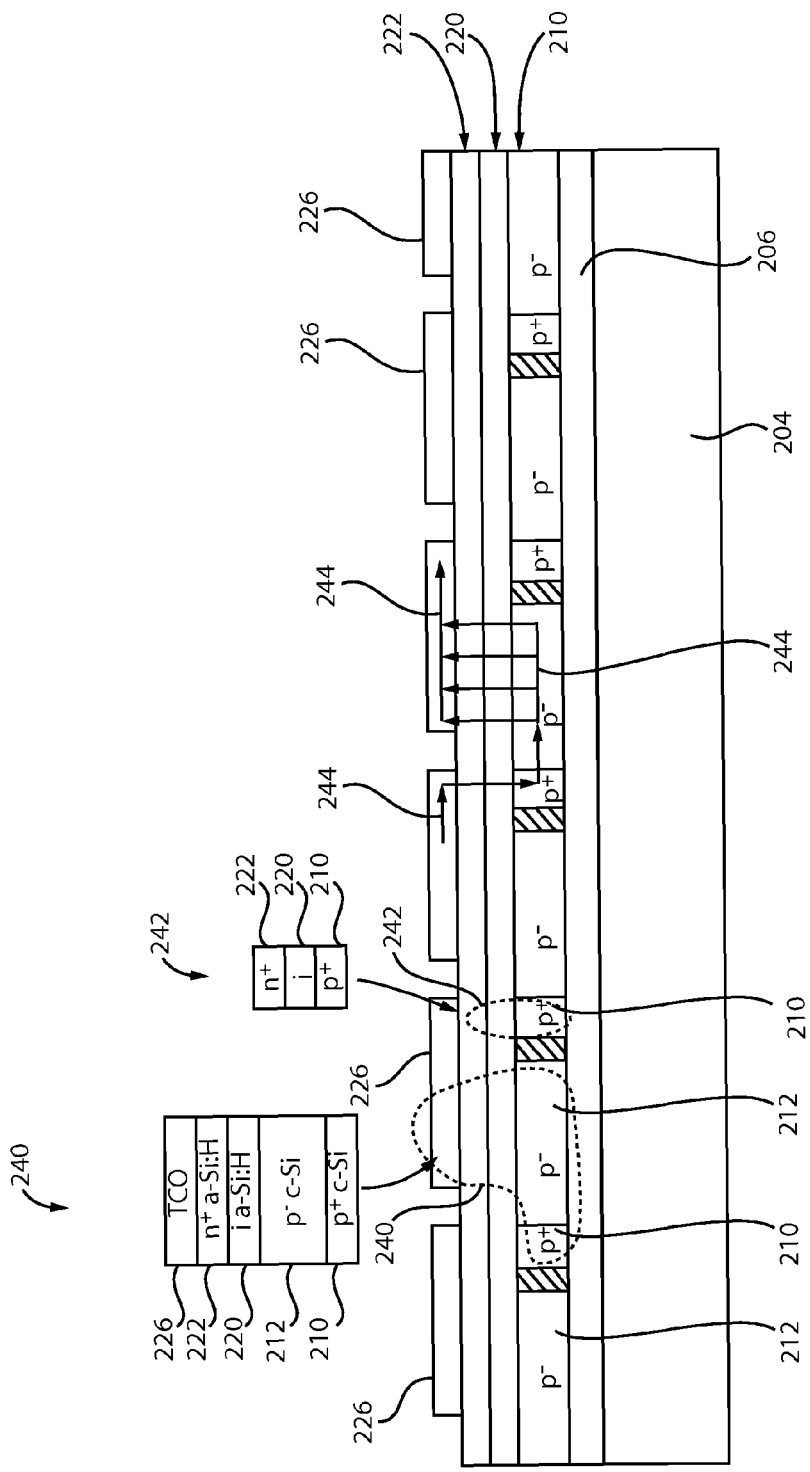
FIG. 4 is a cross-sectional view of the device of FIG. 3B showing heterogeneous photovoltaic cells connected in series in accordance with the present principles.

Referring to FIG. 4, the device of FIG. 3B is illustratively depicted to show series connections between heterojunction cells 240 and tunnel junctions 242. In addition, materials employed are provided to illustrate the structure in accordance with one embodiment, other materials and structures may also be employed. A heterojunction cell 240 includes TCO 226, n+ a-Si:H layer 222, intrinsic a-Si:H layer 220, a p− c-Si substrate 212 and a p+ c-Si substrate 210. Tunnel junction 242 includes n+ a-Si:H layer 222, intrinsic a-Si:H layer 220 and a p+ c-Si substrate 210. Note that similar operation and structure is provided by the structure of FIG. 3B.

In FIG. 4, lines 244 illustratively show the flow of current between cell 240 and junction 242. The cell 240 and junction 242 share at least the substrate layer 208 therebetween and are connected in series through TCO 226 to increase the output voltage of the integrated photovoltaic structure. The open circuit voltage of the integrated photovoltaic structure is, to the first order, equal to the sum of the open circuit voltages of the individual solar cell units connected in series.

Figure 5A:
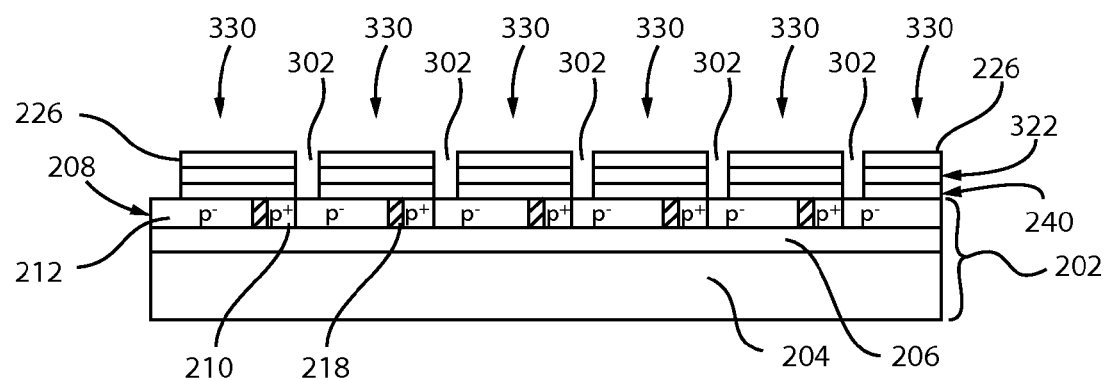
FIG. 5A is a cross-sectional view of a device having a plurality of photovoltaic cells monolithically integrated and connected in series on a SOI substrate with spacings etched through the dope layer to separate the cells in accordance with the present principles.
Figure 5B:
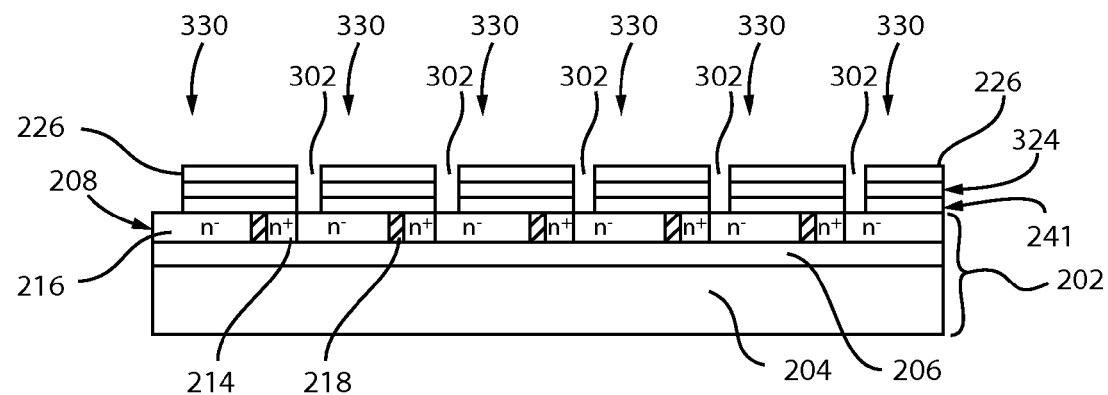
FIG. 5B is a cross-sectional view of the device of FIG. 5A wherein the substrate and doping layer have a dopant type having an opposite conductivity from that of FIG. 5A in accordance with the present principles.

Referring to FIGS. 5A and 5B, in some embodiments, the intrinsic layers (108, 110 (FIG. 1B, FIG. 1C), 220 (FIG. 3A, 3B) of front and/or back stacks may be replaced by a doped hydrogenated crystalline material (e.g., n$^+$ c-Si:H 240 or p$^+$ c-Si:H 241 in FIGS. 5A and 5B, respectively). However, since the lateral conductively is greater in such cases etching through the doped layers is needed to create spacings 302. This is shown schematically in FIGS. 5A and 5B for the structures of FIGS. 3A and 3B; however, it is applicable to either or both of the front and back contacts in FIGS. 1B, 1C and/or 1D. The spacings 302 are preferably created by using a patterned TCO 226 as a mask and etching the layers down to the substrate 208. In other embodiments, the stack may include layer 240 or 241 and/or an intrinsic layer or a doped layer (the same conductivity as layer 240 or 241 which it is in contact with). In these embodiments, the thickness of the doped c-Si:H layers 240, 241 is in the range of about 2-30 nm, although thinner or thicker layers may be used as well.

The hydrogenated crystalline material may be single crystalline, polycrystalline, or combinations thereof. For example, if the substrate 208 is mono-crystalline, the hydrogenated crystalline layers 240 and 241 are single-crystalline, and if the substrate 208 is multi-crystalline, the hydrogenated crystalline layers 240 and 241 are poly-crystalline. In preferred embodiments, the substrate 208 is mono-crystalline, and the hydrogenated crystalline layers 240 and 241 are single-crystalline. The doped hydrogenated crystalline layer may include hydrogen content in the range of 5-40 atomic percent. The doped hydrogenated crystalline layer may include an activated doping concentration higher than $5 \times 10^{18}$ cm$^{-3}$.

For all embodiments, substrate materials (base substrate, thin crystalline substrate layer, etc.) preferably include crystalline materials. Crystalline substrate or crystalline materials refer to single-crystalline or multi-polycrystalline substrates or materials. Other group IV semiconductor materials such as germanium (Ge), silicon-germanium (SiGe), silicon carbide (SiC) and silicon germanium carbide (SiGeC) may also be employed. In addition, group III-V semiconductor materials may be used as well. Examples include but are not limited to gallium nitride (GaN), gallium phosphorus nitride (GaPN), aluminum antimonide (AlSb), aluminum arsenide (AlAs), aluminum nitride (AlN), aluminum phosphide (AlP), boron nitride (BN), boron phosphide (BP), boron arsenide (BAs), gallium arsenide (GaAs), gallium phosphide (GaP), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

In the embodiments described above, a-Si:H has been used as an example of non-crystalline semiconductor material employed for intrinsic and/or doped layers. However, other materials such as hydrogenated amorphous germanium (a-Ge:H), hydrogenated amorphous silicon carbide (a-SiC:H), hydrogenated amorphous silicon germanium (a-SiGe:H), or combinations thereof may be used as well. In addition to or instead of amorphous forms of Si, Ge, SiC, SiGe, etc., the nanocrystalline or microcrystalline forms of these materials or combinations thereof may also be employed.

The amorphous, nanocrystalline, microcrystalline and crystalline forms of the described layers may contain nitrogen (N), oxygen (O), fluorine (F), deuterium (D), chlorine (Cl) or combinations thereof. The amorphous, nanocrystalline, microcrystalline materials may be grown by plasma-enhanced chemical vapor deposition (PECVD), however, other growth techniques known in the art, such as hot-wire CVD (HWCVD) or sputtering may be employed as well. In the case of PECVD or HWCVD, the gas source used for growing Si containing layers is silane ($SiH_4$) although other gases such as disilane ($Si_2H_6$), dichlorosilane (DCS), tetrafluorosilane ($SiF_4$) or combinations thereof may be used as well. These gas sources may be mixed with hydrogen during growth. The gas source used for Ge containing layers may include germane ($GeH_4$). The gas source used for C containing layers may include methane ($CH_4$), ethylene ($C_2H_4$), propylene ($C_3H_6$) but other sources (e.g., of the form $C_xH_y$) may also be employed. Ammonia ($NH_3$), nitrous oxide ($N_2O$) or other gas sources may be used for nitrogen containing layers. Carbon dioxide ($CO_2$), $N_2O$ or $O_2$ may be used to provide oxygen for oxygen containing layers. A carrier gas such as hydrogen ($H_2$), deuterium ($D_2$) helium (He) or argon (Ar) may be used for formation of any or all of the layers. The carrier gas may be pre-mixed with the gas sources or flowed simultaneously with the gas source at the time of growth.

In-situ p-type doping may be performed using diborane ($B_2H_6$) or trimethylboron (TMB) sources, and in-situ n-type doping may be performed using a phosphine ($PH_3$) gas source, although other dopant sources may also be employed.

Hydrogenated crystalline silicon (c-Si:H) has been used as an example of the highly-doped hydrogenated crystalline material. However, c-SiGe:H and c-Ge:H may be employed as well. The gas sources used for the growth of the hydrogenated crystalline Si, Ge (and SiGe) may include but are not limited to $SiH_4$ (silane), $GeH_4$ (germane) (and combinations thereof) and $H_2$. Other examples of Si containing gas sources are $Si_2H_6$ and $SiF_4$. For SiGe layers, a gas flow ratio $[H_2]/([SiH_4]+[GeH_4])>5$ is preferable. Dopant gases (flowed in-situ) may include but are not limited to $PH_3$ (phosphine) for n-type doping, and $B_2H_6$ (diborane) or TMB (tri-methylboron) for p-type doping. These layers may contain nitrogen (N), oxygen (O), fluorine (F), deuterium (D), chlorine (Cl) or combinations thereof. The preferred technique for growing these materials is PECVD, however, other growth methods such as hot wire CVD (HWCVD) may be employed. The PECVD tool may use RF or microwave power and may or may not have a remote-plasma configuration.

Growth temperatures for the above processes are preferably close to 200° C., with highest quality films being grown at temperatures in the range of 150-250° C., however growth temperatures in the range of room-temperature to 450° C. may also be employed. The hydrogen content of the hydrogenated crystalline material is in the range of 5-40 atomic percent. The growth of the hydrogenated crystalline materials may be carried out as described in U.S. patent application Ser. No. 13/032,866 filed on Feb. 23, 2011, and incorporated herein as a reference.

Referring again to FIGS. 1A-1D and FIGS. 3A-3B, with respect to "contacts" formed by the stacks of layers referred to in FIGS. 1A-1D and FIGS. 3A-3B, the intrinsic layers, e.g., 108, 110, 220 may each be a single layer or a multilayer. The composition of the intrinsic layer may be constant or vary across the layer. In some embodiments, the doped layers (e.g., layers 106, 116, 222, 224) are comprised of a bilayer, wherein a second layer has a bandgap lower than that of a first layer of the bilayer (where the first layer is the layer which is in direct contact with the intrinsic layer). In these embodiments, the second layer which has a lower bandgap may have a higher doping activation than the first layer, and provide better majority carrier transport while better repelling the minority carriers from the contact.

In some embodiments, where the doped layer is a bilayer, the doping of the doped layer is enhanced by modulation doping (or transfer doping), i.e. transfer of carriers of the corresponding conductivity type from the material with a larger bandgap into the material with the lower bandgap, or the transfer of the opposite type of carriers from the material with the lower bandgap into the material with a higher bandgap. The carriers corresponding to n-type conductivity are electrons, and the carriers corresponding to p-type conductivity are holes. In some embodiments, the doped layer is comprised of a superlattice, i.e., a multi-layer comprised of alternating materials with low and high bandgaps (with respect to each other), wherein the doping of the narrow gap layers is enhanced by transfer doping. The superlattice structures may be formed by selecting respectively high and low bandgap materials from a group of materials, such as, e.g., a-Si:H, a-Ge:H, a-SiGe:H, a-SiC:H, a-SiO:H, a-SiN:H, nc-Si:H, nc-Ge:H, nc-SiGe:H, nc-SiC:H, nc-SiO:H, nc-SiN:H, μc-Si:H, μc-Ge:H, μc-SiGe:H, μc-SiO:H, μc-SiN:H or combinations thereof.

The bandgap of a-Si:H is typically in the range of 1.7-1.8 eV; however, as known in the art, larger or smaller bandgaps are possible by varying the deposition conditions. The bandgap of a-Ge:H is in the range of 0.9-1.2 eV; however, similar to a-Si:H, larger and smaller bandgaps are also possible. An alloy of two semiconductor materials has a bandgap depending linearly on the atomic fractions of the two semiconductors, e.g., an alloy of a-$Si_xGe_{1-x}$ has a bandgap of $xE_{g1}+(1-x)E_{g2}$, where $E_{g1}$ is the bandgap of a-Si:H, $E_{g2}$ is the bandgap of a-Ge:H, x is the atomic fraction of Si (number of Si atoms in the lattice divided by the total number of Si and Ge atoms), and 1−x is the atomic fraction of Ge. (Note that $0 \le x \le 1$). Similarly, the bandgap of an a-$Si_xC_{1-x}$:H alloy is increased from 1.7-1.8 eV to 3.6-3.7 eV as the atomic fraction of C is increased from 0 to 1. Addition of N, O or both to a-Si:H, a-Ge:H or a-SiGe:H increases the bandgap, but the increase in bandgap is not typically a linear function of the atomic percentage. Hydrogenated amorphous silicon-nitride (a-$Si_xN_{1-x}$:H) has a bandgap of 5-5.5 eV for the stoichiometric composition x=0.42, and the bandgap can be varied by changing the atomic percentage of N. Hydrogenated amorphous silicon oxide (a-SiO:H) has bandgaps comparable with a-SiN:H at comparable atomic fractions of Si.

The bandgap of semiconductor alloys or oxides/nitrides may be varied by changing the crystalline portion of the materials. The bandgap of nanocrystalline or microcrystalline materials is generally lower than that of amorphous materials having the same composition. The bandgap of hydrogenated nano/microcrystalline Si varies between ~1.1 eV to ~1.8 eV as the material structure varies from fully single/poly-crystalline to fully amorphous. Similarly, the bandgap of hydrogenated nano/microcrystalline Ge varies between ~0.6 eV to ~1.2 eV as the material structure varies from fully single/poly-crystalline to fully amorphous. Similarly, the bandgaps of hydrogenated nano/micro-crystalline SiC, SiO, SiGeO, GeO and SiN compounds are lower than that of a-SiC:H, a-SiO:H, a-SiGeO:H, a-GeO:H and a-SiN:H, respectively. This also applies to combinations of these materials. In the PECVD process, the crystalline portion of the materials may be increased by increasing the hydrogen dilution of the source gases, increasing the plasma frequency (e.g., up to 120 MHz) or both. For example, hydrogenated nano-crystalline silicon oxide (nc-SiO:H) may be grown by PECVD with a bandgap in the range of 0.8-2.5 eV, depending on the growth conditions and oxygen content of the film.

Figure 6:
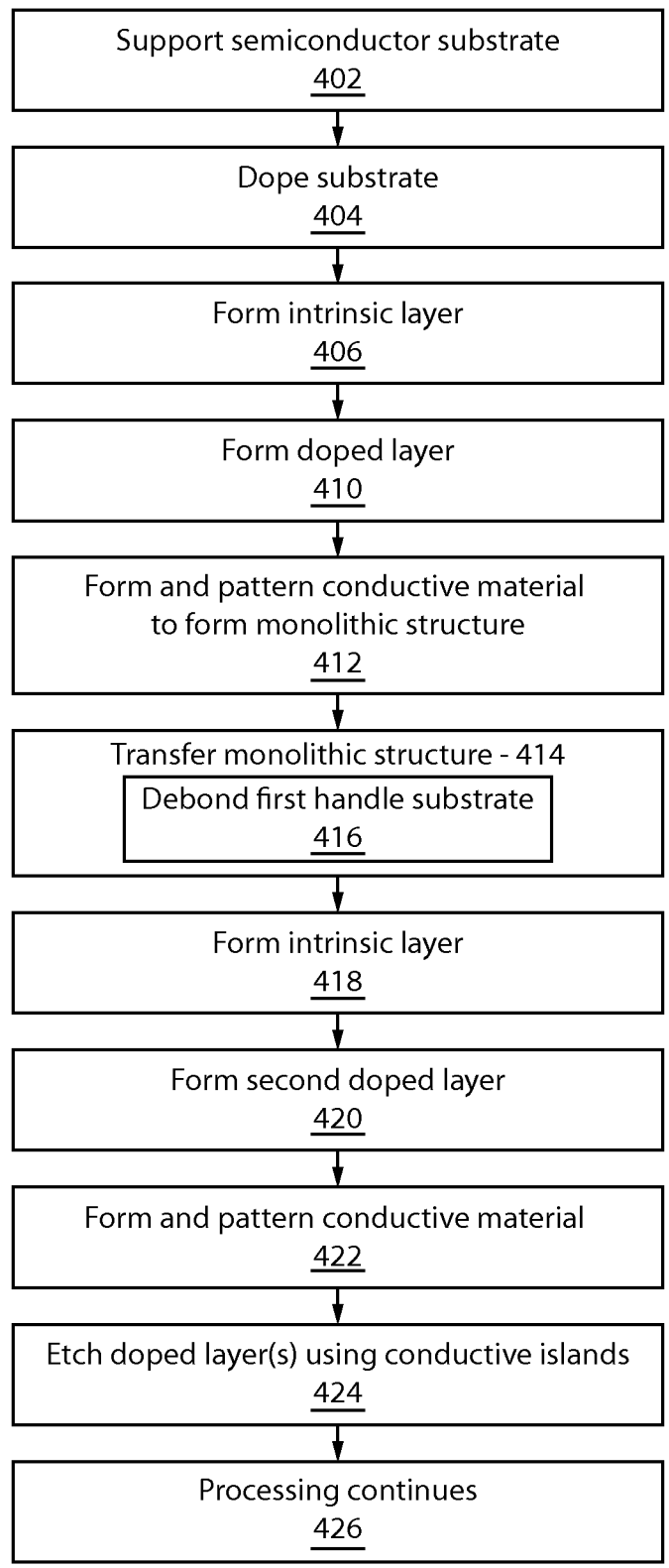
FIG. 6 is a block/flow diagram showing methods for forming the devices of FIGS. 1A-1D in accordance with illustrative embodiments.
Figure 7:
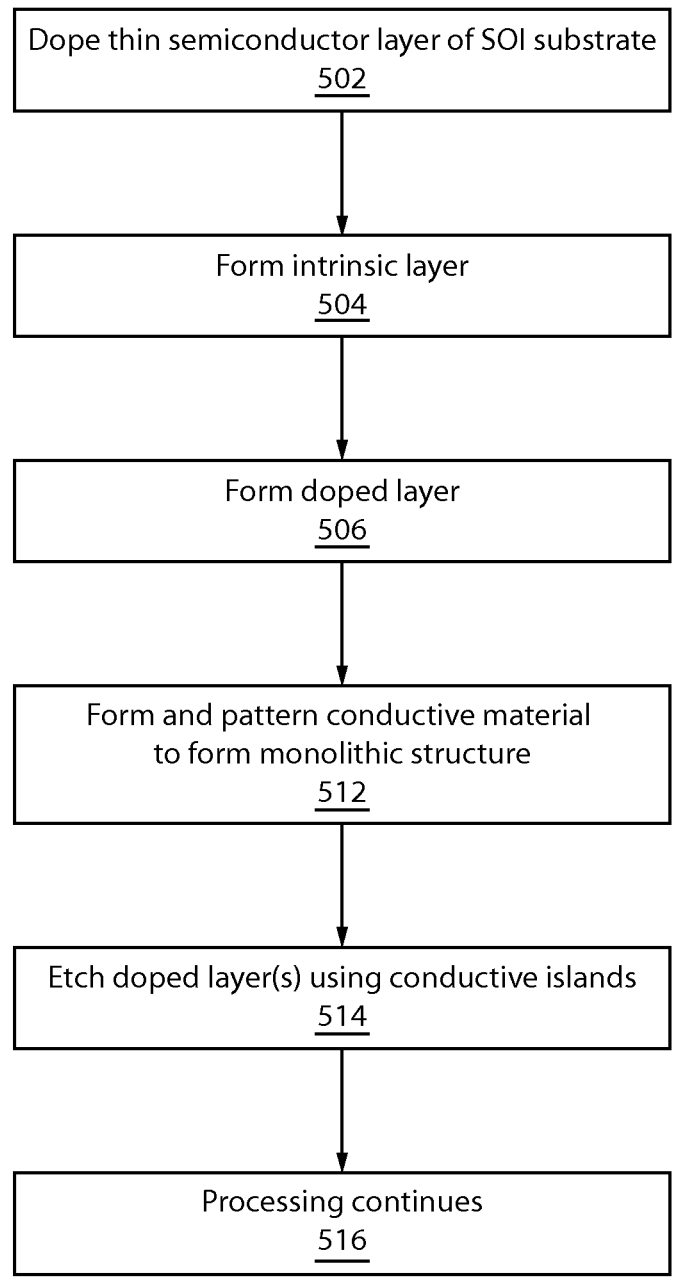
FIG. 7 is a block/flow diagram showing methods for forming the devices of FIGS. 3A-3B and FIGS. 5A-5B in accordance with illustrative embodiments.

Referring to FIGS. 6 and 7, flowcharts/block diagrams in FIGS. 6 and 7 illustrate the architecture, functionality, and operation of possible implementations according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Referring to FIG. 6, a method for fabricating a device with integrated photovoltaic cells is illustratively shown. In block 402, a semiconductor substrate is supported on a first handle substrate. A sacrificial layer or layers may be employed between these substrates to selectively debond the substrates during a transfer process.

In block 404, the semiconductor substrate is doped to form alternating doped regions with opposite conductivity. Isolation regions may also be formed. In block 406, an intrinsic layer may be formed on the semiconductor substrate. In block 410, at least one doped layer is formed over a first side the semiconductor substrate. In one embodiment, forming at least one doped layer includes forming a continuous doped layer through the plurality of cells. The at least one doped layer includes a doped non-crystalline form of a semiconductor material, which provides a high lateral resistive path to prevent lateral conduction between the plurality of cells.

In block 412, a conductive material is patterned over the least one doped layer to form conductive islands such that the conductive islands are aligned with the alternating doped regions on the substrate to define a plurality of photovoltaic cells connected in series on a monolithic structure. The conductive material of the conductive islands may include a transparent conductive oxide.

In block 414, the monolithic structure may be transferred to a second handle substrate. In block 416, the monolithic structure is debonded from the first handle substrate to expose a second side of the semiconductor substrate or to complete the device. This may include an etch process of a sacrificial layer or the like.

In block 418, an intrinsic layer may be formed on the semiconductor substrate. In block 420, at least one other doped layer is formed over the second side the semiconductor substrate. In block 422, another layer of conductive material is patterned over the least one other doped layer to form conductive islands such that the conductive islands are aligned with the alternating doped regions of the substrate to further define photovoltaic cells connected in series on the monolithic structure. The second handle substrate may be transparent and remain on the monolithic structure to form a bifacial device. The second handle substrate may also be removed to form a bifacial device.

In another embodiment, in block 424, an etch of the at least one doped layer may be performed using the conductive islands as an etch mask or otherwise to break up the doped layer or layers to prevent lateral conduction between cells through the doped layer or layers. This may include providing doped layers instead of the intrinsic layers to provide a conductive path. In block 426, processing continues to complete the device.

Referring to FIG. 5, another method for fabricating a device with integrated photovoltaic cells is shown. In block 502, a semiconductor layer on a buried dielectric layer of a semiconductor-on-insulator substrate is doped to form alternating doped regions of higher and lower dopant concentration across the semiconductor layer. Isolation regions may also be formed. In block 504, an intrinsic layer may be formed between the at least one doped layer and the semiconductor layer.

In block 506, at least one doped layer is formed over a first side the semiconductor layer. In one embodiment, a continuous doped layer is formed through the plurality of cells, and the at least one doped layer includes a doped non-crystalline form of a semiconductor material to prevent lateral conduction between the plurality of cells.

In block 512, a conductive material is patterned over the least one doped layer to form conductive islands such that the conductive islands are aligned with the alternating doped regions to define a plurality of photovoltaic cells connected in series on a monolithic structure. The conductive material for the conductive islands may include a transparent conductive oxide. In block 514, in another embodiment, the at least one doped layer includes a crystalline semiconductor, and the at least one doped layer is etched using the conductive islands as an etch mask. This prevents lateral conduction when conductive materials are employed for the doped layers. This may include providing doped layers instead of the intrinsic layers to provide a conductive path. In block 516, processing continues to complete the device.

Having described preferred embodiments for monolithic integration of heterojunction solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a device with integrated photovoltaic cells, comprising:
   supporting a semiconductor substrate on a first handle substrate;
   doping the semiconductor substrate to form alternating regions with opposite conductivity;
   forming at least one doped layer over a first side of the semiconductor substrate; and
   patterning a conductive material over the least one doped layer to form conductive islands such that the conductive islands are aligned with the alternating regions to define a plurality of photovoltaic cells connected in series on a monolithic structure.

2. The method as recited in claim 1, further comprising:
   transferring the monolithic structure to a second handle substrate; and debonding the monolithic structure from the first handle substrate to expose a second side of the semiconductor substrate.

3. The method as recited in claim 2, further comprising:
   forming at least one other doped layer over the second side of the semiconductor substrate; and
   patterning a conductive material over the least one other doped layer to form conductive islands such that the conductive islands are aligned with the alternating regions of opposite conductivity to further define the plurality of photovoltaic cells connected in series on the monolithic structure.

4. The method as recited in claim 3, wherein the second handle substrate is transparent and the monolithic structure forms a bifacial device.

5. The method as recited in claim 3, further comprising removing the second handle substrate to form a bifacial device.

6. The method as recited in claim 3, further comprising forming an intrinsic layer between the at least one other doped layer and the semiconductor substrate.

7. The method as recited in claim 1, wherein forming at least one doped layer includes forming a continuous doped layer through the plurality of cells, the at least one doped layer including a doped non-crystalline form of a semiconductor material to prevent lateral conduction between the plurality of cells.

8. The method as recited in claim 1, further comprising etching the at least one doped layer using the conductive islands as an etch mask.

9. The method as recited in claim 8, further comprising forming a doped hydrogenated crystalline layer between the at least one doped layer and the semiconductor substrate having a same conductivity as the at least one doped layer and etching the doped hydrogenated crystalline layer in accordance with the etch mask.

10. The method as recited in claim 1, further comprising forming an intrinsic layer between the at least one doped layer and the semiconductor substrate.

\* \* \* \* \*